(12) United States Patent
Abadeer et al.

(10) Patent No.: US 6,844,747 B2
(45) Date of Patent: Jan. 18, 2005

(54) WAFER LEVEL SYSTEM FOR PRODUCING BURN-IN/SCREEN, AND RELIABILITY EVALUATIONS TO BE PERFORMED ON ALL CHIPS SIMULTANEOUSLY WITHOUT ANY WAFER CONTACTING

(75) Inventors: Wadgi W. Abadeer, Jericho, VT (US); William T. Motsiff, Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/811,915

(22) Filed: Mar. 19, 2001

(65) Prior Publication Data

US 2002/0132378 A1 Sep. 19, 2002

(51) Int. Cl.[7] .............................................. G01R 31/02
(52) U.S. Cl. ...................................... 324/750; 324/765
(58) Field of Search .............................. 324/750, 765, 324/500–501, 225; 438/14–18; 702/84

(56) References Cited

U.S. PATENT DOCUMENTS

| | | | |
|---|---|---|---|
| 3,890,564 A | * | 6/1975 | Watanabe et al. ........... 324/225 |
| 5,399,101 A | | 3/1995 | Campbell et al. |
| 5,412,328 A | | 5/1995 | Male et al. |
| 5,424,651 A | | 6/1995 | Green et al. |
| 5,429,520 A | | 7/1995 | Morlion et al. |
| 5,440,241 A | | 8/1995 | King et al. |
| 5,442,297 A | | 8/1995 | Verkuil |
| 5,485,091 A | | 1/1996 | Verkuil |
| 5,489,538 A | | 2/1996 | Rostoker et al. |
| 5,498,974 A | | 3/1996 | Verkuil et al. |
| 5,519,193 A | | 5/1996 | Freiermuth et al. |
| 5,528,159 A | | 6/1996 | Charlton et al. |
| 5,552,704 A | | 9/1996 | Mallory et al. |
| 5,570,032 A | | 10/1996 | Atkins et al. |
| 5,578,930 A | | 11/1996 | Sheen |
| 5,600,257 A | | 2/1997 | Leas et al. |
| 5,625,297 A | | 4/1997 | Arnaudov et al. |
| 5,661,408 A | | 8/1997 | Kamieniecki et al. |
| 5,831,445 A | | 11/1998 | Atkins et al. |
| 5,898,629 A | | 4/1999 | Beffa et al. |
| 5,929,652 A | * | 7/1999 | Ahrenkiel .................... 324/766 |
| 5,945,834 A | | 8/1999 | Nakata et al. |

OTHER PUBLICATIONS

"Wafer Level Test and Burn In", *IBM Technical Disclosure Bulletin*, Jan. 1992, pp. 401–404.

"Multi–Layer Ceramic Space Transformer for Wafer Level Stress", *IBM Technical Disclosure Bulletin*, Apr. 1999, pp. 385–386.

"Wafer Burn–In Isolation Circuit", *IBM Technical Disclosure Bulletin*, Nov. 1989, pp. 442–443.

* cited by examiner

*Primary Examiner*—Vinh P. Nguyen
(74) *Attorney, Agent, or Firm*—Scully, Scott, Murphy & Presser; Robert A. Walsh

(57) ABSTRACT

A wafer level system for producing burn-in, voltages screen, and reliability evaluations which are to be performed on all wafers simultaneously without necessitating the probe contacting of any wafer during burn-in/stress. Also provided is a method for implementing the wafer level product burn-in/screen, and semiconductor reliability evaluations on semiconductor chips pursuant to the wafer level system. Pursuant to a preferred aspect all chips of a wafer are stressed simultaneously without having a probe physically contact any chip during the stress procedure. This concept can be applied to burn-in of product wafers, voltage screen of product wafers, and reliability evaluations of various failure mechanisms.

50 Claims, 8 Drawing Sheets

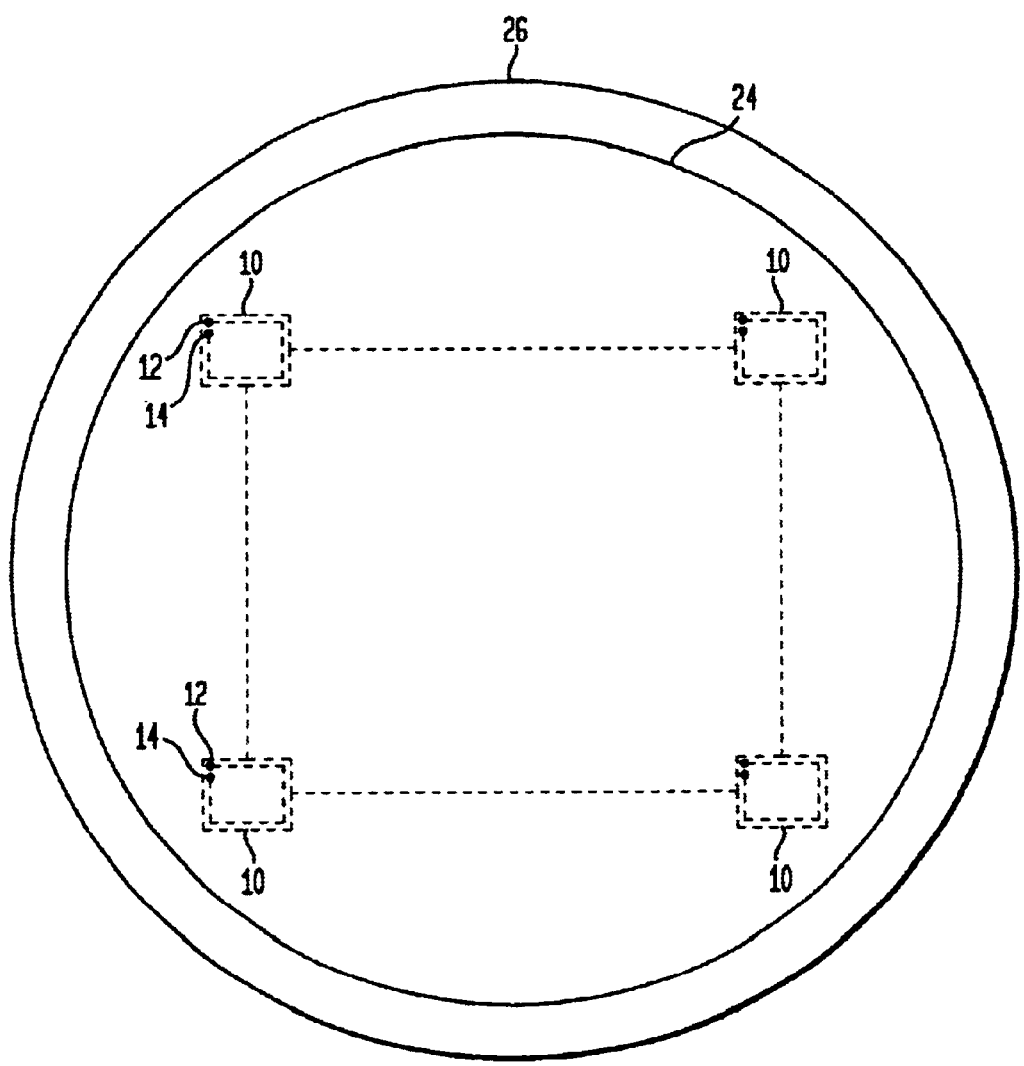

US 6,844,747 B2

WAFER LEVEL SYSTEM FOR PRODUCING BURN-IN/SCREEN, AND RELIABILITY EVALUATIONS TO BE PERFORMED ON ALL CHIPS SIMULTANEOUSLY WITHOUT ANY WAFER CONTACTING

BACKGROUND OF THE INVENTION

1. Field of the Invention

The present invention relates to a wafer level system for producing burn-in, voltages screen, and reliability evaluations which are to be performed on all wafers simultaneously without necessitating the contacting of any wafer. More particularly, the invention also relates to method for implementing the wafer level product burn-in/screen, and semiconductor reliability evaluations on semiconductor chips pursuant to the wafer level system.

In order to reduce the extent of any reliability failure rate which may be encountered during the early life of integrated circuits, semiconductor VLSI/ULSI products are usually subjected to burn-in or temperature/voltage screens that are designed to screen out any present or potential failures due to manufacturing defects, which otherwise may occur at an early time during field operations. The burn-in is normally carried out at the packaged level of individual product chips, whereby each product wafer is initially diced out and each product chip is mounted in a package which could be constituted of plastic or ceramic. The individual packaged product chips are then mounted on custom designed circuit boards, and these boards are thereafter placed in burn-in chambers where temperature are readily controlled to up to 140 C or even higher. These circuit boards are custom designed for each type of product or product family (e.g. SRAM, DRAM, LOGIC . . . ) where the power supply pin or pins on each product chip package is or are energized through the power supply buses provided on the printed circuit board or card. Moreover, the data and address pins or the product chips are connected through special buses to externally supplied data and address lines.

Consequently, through the application of this package level stress system, many product packaged chips are placed under the burn-in process for a period that can readily range from about 2 hours up to 24 hours, or even lengthier periods of time. During the burn-in process, the integrated product chips are dynamically stressed under elevated voltage and temperature conditions. Across the extent of the industry, it has been recognized, for some users, that the presently employed and generally conventional burn-in procedure is quite expensive and resultingly contributes significantly to the overall cost of the product, however, at the same time it is deemed to be an important procedure which semiconductor manufactures must necessarily implement in order to sell product chips possessing a good reliability, but which means having to sell them for more money. The high cost of burn-in stems from the need for custom designed stress cards for each product, product family, package or package type, and the need for furnishing high temperature stress chambers which are custom built with the provision of stressors able to exercise each product dynamically and in a manner which closely controls the magnitude, and timing of the various supply pins, data buses and address signals. A considerable amount of labor and expenditure of money is involved in the process of implementing the designing, building, and maintaining those stressors and stress boards, as well as conducting of the burn-in procedure. There is also encountered the problem of low burn-in efficiency and burn-in escapes, represented by those particular chips which are not imparted a proper or adequate burn-in on a given stressor system, for example, due to broken pins, faulty connections, and inadequate handling of the packaged chips.

Another important procedure which semiconductor manufacturers carry out in order to improve upon encountered premature or early failure rate is a voltage screen, which involves applying a high voltage at a moderate temperature for a period of only a few seconds or the like. The voltage can be applied statically or in a dynamic manner.

These screens are usually implemented at wafer level, by means of a probe contacting one wafer at a time. For the screens, the temperature cannot be as high as desired, because of possible probe contact problems at high temperature. The problems with the present system for voltage screens are; firstly the cost involved with probe contacting only one chip at a time, and secondly, the necessary temperature limitations.

In addition to the foregoing difficulties encountered in the technology, the performance of semiconductor technology reliability evaluations for the various reliability failure mechanisms, during technology development represents another source of excessively high cost and time factors with regard to the overall test program budget. Normally, the reliability failure mechanisms which are usually evaluated include: electromigration, dielectric reliability, hot carriers, bias temperatures stability, vias and contacts. These reliability failure mechanisms are normally evaluated in an individual manner, employing specially designed test structures, test and stress conditions for each mechanism. Many, if not all, of the reliability failure mechanisms are evaluated at wafer level, by probe by singly contacting each chip one-at-a-time in order to perform the required stress procedure. It is also important to note, that for every failure mechanism, many different test structures are specifically designed to carry out only a specific purpose, such as a specific type of device layout, certain specific design dimensions, or to perform a predetermined design function. The individual test structures (or test macros) are usually closely packed inside the test chip, with sufficiently small probe pad sizes, such that normally only one test structure, (or macro) is probed and stressed an any given instance of time. Consequently, stressing all of the required test structures for all the reliability failure mechanisms is a very time consuming and intensive process, and represents a substantial portion of the overall development costs. Each evaluation of a specific reliability mechanism, requires certain stress conditions, such as a constant current at elevated temperatures for electromigration and dielectric reliability, a constant voltage at low or elevated temperatures for hot carriers, a bias temperature stability, and dielectric reliability. Thus, were it possible to be able to supply certain current or voltage conditions on each test structure, it would become possible to evaluate many mechanisms simultaneously, since there could be employed a common temperature for conducting the stress for those mechanisms.

In manufacturing, routine in-line reliability monitoring is an absolute requirement in order to protect the quality and reliability of shipped products. This monitoring is implemented for many, if not for all of the key reliability failure mechanisms. The monitoring for reliability failure mechanisms has to be carried out such that the stress time involved in the evaluation is sufficiently short, so that the routine testing for adequate numbers of samples is economical in its application. The testing on each wafer is done for a certain number of chips, by the probe contacting each chip one at-a-time. For high volume manufacturing production, the number of wafers monitored for reliability is very high, such that the total time required to perform the stress testing on all chips becomes quite significant. However, in the event that the stress testing can be performed on many or all chips simultaneously, that would represent a significant saving in the overall time required for that purpose.

2. Discussion of the Prior Art

Although a considerable amount of investigative work has been carried out in the technology in connection with wafer level burn-in, particularly for all chips simultaneously, the current state-of-the-technology still does not clearly provide for a unique and advantageously implementable wafer level system analogous to that disclosed by the present invention.

In the present state-of-the-technology, there are many patents which direct themselves to for wafer level burn-in of all chips simultaneously; however they are all based on systems or structures which enable making common connections to all chips on the wafer, and those common connections are accessible through pads to external exercises for burn-in procedures. All of the concepts used for this prior art require complicated systems with difficult requirements of tolerances, thermal properties and matching properties. Also, these prior art publications would not be satisfactory for very high frequency chip technology because of the need for additional off chip contacting fixtures.

Among the foregoing patents which are considered to be of general interest, but which are not applicable to the inventive concept as set forth and claimed herein are Leas, et al. U.S. Pat. No. 5,600,257; Charlton, et al. U.S. Pat. No. 5,528,159; Anschel, et al. U.S. Pat. No. 5,420,520; Campbell, et al. U.S. Pat. No. 5,399,101; Smith, et al. U.S. Pat. No. 5,047,711; Kreiger, et al. U.S. Pat. No. 5,210,485; Devereaux, et al. U.S. Pat. No. 5,279,975; Chiu U.S. Pat. No. 5,307,010; Rostoker, et al., U.S. Pat. No. 5,389,556; Green, et al. U.S. Pat. No. 5,424,651; King, et al. U.S. Pat. No. 5,440,241; Rostoker, et al. U.S. Pat. No. 5,489,538; and Atkins, et al. U.S. Pat. No. 5,570,032.

There are also patents and other publications in evidence which disclose methods and systems that allow contactless testing of all chips on a wafer simultaneously without having to probe each chip at a time. It should be noted, however, that those prior art publications are primarily for initial device characterization and measurements, and not for burn-in, voltage screen, or reliability evaluations of failure mechanisms.

Thus, Verkuil U.S. Pat. No. 5,216,362, which is commonly assigned to the present assignee, discloses a system intended to measure epitaxial dopant profile in semiconductor wafers in a non-contacting procedure. This is achieved by forming a temporary P-N junction in the surface of the semiconductor wafer using Corona discharge.

Verkuil et al. U.S. Pat. No. 4,812,756 is concerned with disclosures of a contactless technique which allowed for making time retention and epi-doping concentration measurements.

In Verkuil U.S. Pat. No. 5,485,091 a contactless system is employed for measuring the thickness of very thin oxide layers on a silicon substrate. This is effected by a Corona discharge source which repetitively deposits a calibrated fixed charge density on the surface of the oxide, and the resultant change in oxide surface potential for each charge deposition is measured. In Verkuil U.S. Pat. No. 5,442,297), a contactless system is described which measures the sheet resistance of a desired layer of a first conductivity type formed upon a substrate of an opposite conductivity type. The apparatus comprises a junction capacitance establishing means, a point location alternating current AC photovoltage, an attenuation and phase shift monitoring means for monitoring the laterally propagated AC photovoltage, and a sheet resistance signal generating means responsive to the junction capacitance establishing means, the AC photovoltage generating means, and the attenuation and phase shift monitoring means for generating an output signal indicative of a sheet resistance.

Also set forth in a copending U.S. patent application Ser. No. 09/250,880, W. A. Abadeer, et al. entitled "Apparatus and Method for Non-Contact Stress evaluation of Wafer Gate Dielectric Reliability", is a wafer contactless system for gate dielectric reliability stress evaluation. In the system described therein, exposure of wafer to hydrogen plasma was shown to induce degradation in the thin gate dielectric, and this degradation was correlated and related to the systematic process of thin gate dielectric degradation, leading to breakdown under conventional voltage/temperature stressing with probe contacting.

In this prior art, wherein wafers are exposed to the hydrogen plasma and the change in interface state density due to hydrogen exposure is measured. That system, however, cannot be used for fully processed and integrated wafers with metal levels because the lateral transport of atomic hydrogen in metal-oxide-semiconductor capacitors with aluminum or polysilicon gates is extremely limited. This means that the evaluation for gate dielectric reliability need to be done on gate free samples after the deposition of the thin gate dielectric, without depositing an polysilicon or metal levels. Also the technique can not be used for evaluation of other reliability failure mechanisms such as hot carriers, electromigration and bias temperature stability. It also cannot be used for burn-in of product chips.

SUMMARY OF THE INVENTION

Accordingly, in order to obviate the drawbacks and limitations encountered in the prior art, the present invention provides for a novel solution implementing the wafer level system of the type as described herein.

A novel solution to the above problems encountered in the technology is presently by the present invention. The solution is based on a technique through the intermediary of which all chips of a wafer are stressed simultaneously without having a probe physically contact any chip during the stress procedure. This inventive concept can be applied to burn-in of product wafers, voltage screen of product wafers, and reliability evaluations of various failure mechanisms.

The object of the present invention is predicated on creating the necessary voltage bias conditions by inducing the voltage for a loop or circuit, using a time varying magnetic field that is fixed with respect to the circuit loop, according to Faraday's law. The induced voltage is achieved at a top layer of a special mask to be placed on the product wafer. Connections are made to the chip by the special mask for burn-in, and this additional mask can be re-used for burn-in of other wafers, and does not interfere with the normal operation of the chip.

Accordingly, an object of the present invention is to provide a method which generates a controlled burn-in voltage and procedure on product chips for all chips on a wafer simultaneously without any probe contacting each chip at any time.

Another object of the invention resides in the provision of a system to achieve the contactless controlled burn-in voltage in accordance with the inventive method.

A more specific object resides in the provision of a system which achieves particular objects of the contactless burn-in and utilizing the method and system pursuant to the invention.

Another object of the invention resides to the provision of arrangement of achieving an economical and practical aspect of supplying the generated burn-in voltage to each chip for the case of P− silicon substrates.

Another object of the present invention resides in providing an arrangement of achieving an economical and practical system for supplying the generated burn-in each chip for the case of P+ silicon substrates.

Yet another object of the present invention resides in providing a system which will perform reliability evaluations for multiple reliability mechanisms and all chips of a wafer or wafers simultaneously without a probe contacting each chip at any time.

Furthermore, pursuant to the invention another object resides in the provision of a system as described herein utilizing an interposer which facilitates contact with the wafer surface which may be constructed in a manner of a decal.

BRIEF DESCRIPTION OF THE ACCOMPANYING DRAWINGS

Reference may now be made to the following detailed description of preferred embodiments of the invention, taken in conjunction with the accompanying drawings; in which:

FIG. 3c illustrates, on a further enlarged scale, a detail of a wafer, chips on wafer and mask on each chip, as utilized in FIG. 3a;

DETAILED DESCRIPTION OF PREFERRED EMBODIMENT

Figure 1:
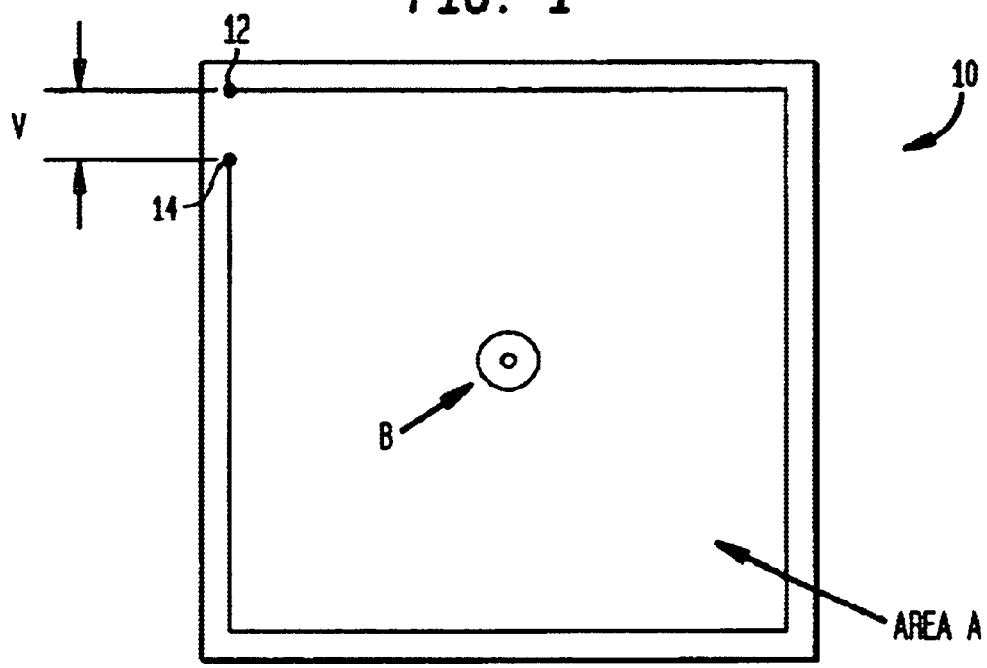
FIG. 1 illustrates a representation of an induced voltage by a time varying magnetic field within a specified area.
Figure 2:
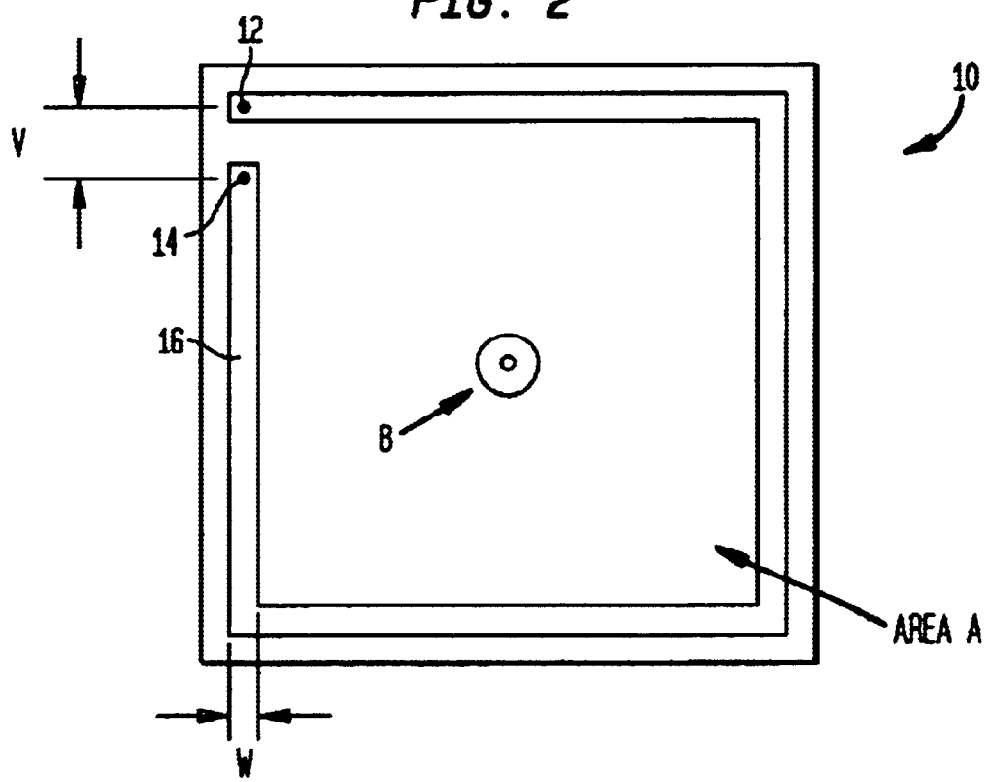
FIG. 2 illustrates a top view of a metal line around the area of FIG. 1 to induce voltage.

The solution to the problems in the prior art, as presented by the present invention, is based on Faraday's law that gives the electric field, and hence voltage, which is induced by a time rate of change of a magnetic field for a loop circuit which is fixed with respect to the magnetic field. The loop 10, as shown in FIGS. 1 and 2, is a fixed rectangular loop 10 of area A and the flux density B is normal to the plane of the loop (FIG. 1) and is uniform over the area of the loop. The magnitude of B varies harmonically with respect to time as given by:

$$B = B_o \cos \omega t \tag{1}$$

The induced voltage V is given by:

$$V = (dB/dt)A \tag{2}$$

Where (dB/dt) is the time rate of change for the magnetic field. Substituting with equation (1) into equation (2), one obtains:

$$V = A\omega B_o \sin \omega t \tag{3}$$

The induced voltage follows from the Maxwell's Equation, often referred to as Faraday's law. For this invention, the value of $B_o$ ranges from 10 Gauss to about 50 Gauss, with a typical operating value for this invention of 20 Gauss. The frequency f for the time varying magnetic field varies from 0.8 MHz to about 5 MHz with a typical operating value for this invention of 2 MHz. The area A of the loop 10 ranges from 0.8 cm×0.8 cm to about 1.3 cm×1.3 cm, with a typical operating point for this invention of 1 cm×1 cm or 1 cm². Thus, substituting with the given design values for this invention in equation (3), one obtains:

$$V = 2.51 \sin \omega t \text{ (Volts)} \tag{4}$$

Thus, the maximum generated voltage for this design point is 2.5 V which would be suitable for ultra thin gate dielectric CMOS technologies. The range of the maximum value of the induced voltage V is from 2 volts to about 5 volts, with a typical preferred operating value for the present invention of 2.5 volts. The loop 10 with the area A is placed using a special mask processing on the top of the integrated chip, and with details of the special mask system being described hereinbelow. The top view of the loop 10 is shown in FIG. 2 for the case demonstrated in the invention, where one loop per chip is used, and the loop 10 has only two points 12,14 (ends) for making connections with the chip. The width W of the loop 10 ranges from 240 μm to 620 μm, with a typical operating value employed for the invention of 400 μm. The width W of the metal line 16 forming the loop 10 is such that the resistance of the total loop and, hence the voltage drop in the line 16 forming the loop is sufficiently small as compared with the generated induced voltage V. The metal forming the loop 10 is typically made of copper; however it can also be constituted of aluminum.

In order to produce the time varying magnetic field, two different systems are described in connection with the invention. The two systems are designed to achieve certain advantages or certain operating conditions.

Figure 3:
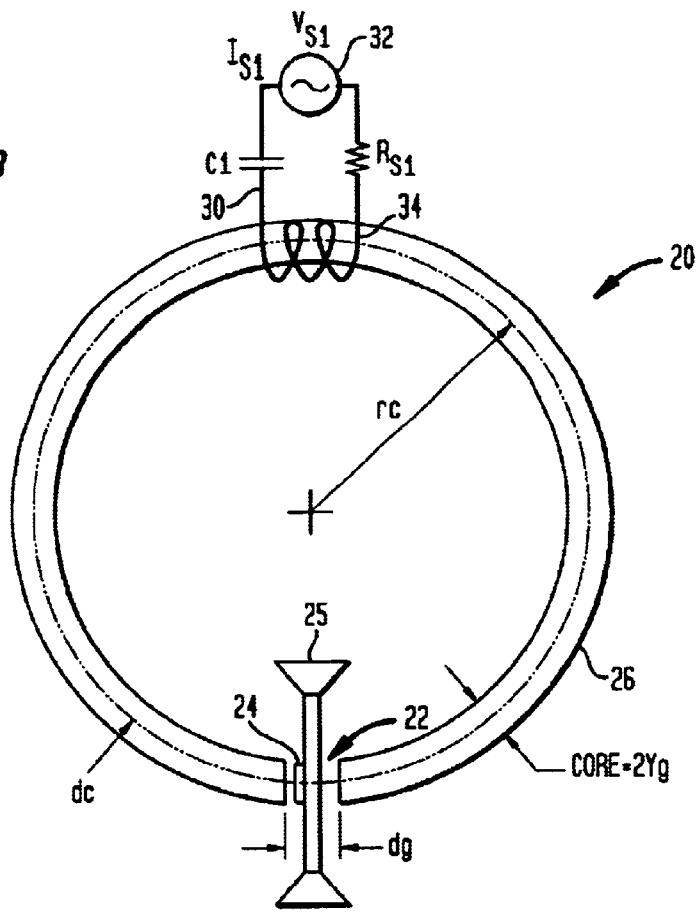
FIG. 3 illustrates a side view representative of a first magnetic system, including a magnetic core with an air gap.
Figure 3A:
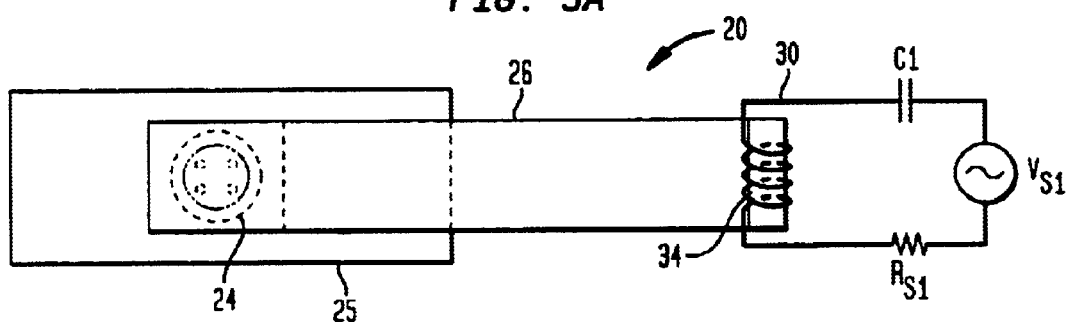
FIG. 3a illustrates a top plan view of a first magnetic system pursuant to the invention.
Figure 3B:
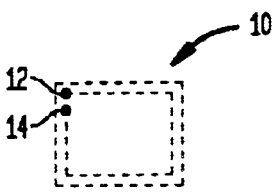
FIG. 3b illustrates an enlarged view of a chip arranged on the first magnetic system.
Figure 4:
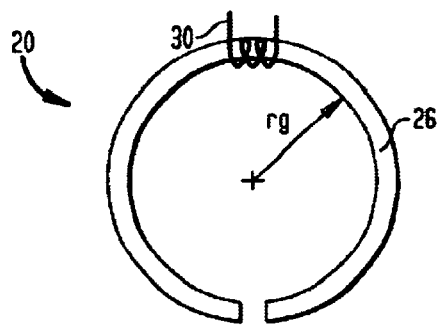
FIG. 4 illustrates a cross-section of the magnetic core.

The first system 20 described in this invention is shown in FIGS. 3, 3a, 3b and 3c for the case where one wafer is subjected to burn-in. The system shown in FIG. 3 is a magnetic circuit with air gap 22, and the wafer 24 is placed in the air gap, preferably mounted on a wafer holder 25 of a dielectric material. The circular magnetic core 26 is made of Permalloy powder, with a composition of 2% Mo and 81% Ni by weight, and the remainder is iron and impurities (see "Electromagnetic" 1984, Section 6-4, page 216, Table 6-1, ibid), and a relative permeability, $\mu_r$ of 130. The air gap 22 of the magnetic circuit is such as to cover an 8 inch diameter wafer 24, such as is currently used in semiconductor manufacturing. However, it should also be noted that this system 20 is extendible to other contemplated wafer sizes in excess of 8 inches in diameter. The cross section of the circular magnetic circuit is shown in FIG. 4, and has a radius $r_g$ of 4 inches or 10.16 cm, and a cross sectional $A_c$ of 324.3 cm². The magnetic core of FIG. 3 has a radius $r_c$ of 54.38 cm, the length $d_c$ of the circumference of the magnetic core is 341.68 cm, and the length $d_g$ of the air gap is 2 cm. The magnetic field lines (B) follow the magnetic core 26 and are perpendicular to the wafer surface at the air gap 22. Thus, for any chip on the wafer 24, as shown in FIG. 2, there will be induced a voltage V which is produced at the terminals of the loop with area A which is placed on the top of the chip. The magnetic circuit of FIGS. 3 and 3a, is energized by N1 turns of an isolated electrical wire 30 which is connected in series with a capacitance C1 and a time varying voltage source 32 of the following voltage source amplitude:

$$V_{s1} = V_1 \sin \omega t \qquad (5)$$

The inductance of the coil 34 of wire 30 with N1 turns is given by article "Electromagnetic" 1984, Section 5.13, page 166, ibid:

$$L_1 = (\mu_o \mu_r N1^2 A_c)/d_1 \qquad (6)$$

where $d_1$ is the total length of the coil with N1 turns, and $\mu_o$ is the permeability of free space (8.854×10⁻¹², Henry/m). $d_1$ is given by:

$$d_1 = N1 \times 2 \times \pi \times r_g \qquad (7)$$

The current $I_{s1}$ generated in the coil by the voltage source is given by:

$$I_{s1} = I_1 \sin \omega t \qquad (8)$$

The magnetic flux density B generated in the air gap 22 of the magnetic circuit is given by (Applied Electromagnetics, Martin A. Pimus; McGraw-Hill Book, Co., 1978, Section 10.5, page 406):

$$B = B_o \sin \omega t = \mu_o N1 I_1/(d_g + d_c/\mu_r) \sin \omega t \qquad (9)$$

Substituting with the values $d_g$, $d_c$, $B_o$, $\mu_o$, and $\mu_r$ in equation (9), one obtains a value for the product $N1.I_1$ given by:

$$N1.I_1 = 73.7 \text{ Ampere-turns} \qquad (10)$$

The value of N1 for this invention is two (2) turns, with a range of 1 to 4 turns. Thus the value of the peak amplitude of the current $I_1$ is 36.85 Amperes, and the range of $I_1$ is 20 Amperes to 60 Amperes. Substituting with the value of N1 in equation (7), one obtains a value of 1.277 meters for the length $d_1$. Substituting with the values of $\mu_o$, $\mu_r$, N1, $d_1$, and $A_c$ in equation (6), one obtains a value of 16.6 μHenry for the coil inductance $L_1$. The coil 34 with N1 turns is made of copper wire strands with a total diameter of 5 mm. The total resistance of the copper wire coil R1 is much less than one Ohm. The capacitance C1 in FIGS. 3 and 3A for the magnetic circuit is to provide a resonant circuit with the inductance $L_1$. Thus the capacitance $C_1$ is given by (frequency is 2 MHz):

$$C1 = 1/(\omega^2 L_1) = 381.5 \text{ Pico Farad} \qquad (11)$$

The peak amplitude of the voltage $V_1$ is such as to provide the current $I_1$ to the coil with N1 turns. Thus the value of $V_1$ is given by:

$$V_1 = R_{s1} I_1 \qquad (12)$$

The resistance $R_{s1}$ is the total resistance of the magnetic circuit in FIGS. 3 and 3A, comprising the coil with N1 turns, the capacitance C1, and the voltage source $V_{s1}$. The Q1 factor (Quality factor) for the coil inductor is calculated from:

$$Q1 = \omega L_1/R_{s1} \qquad (13)$$

From equation (13) one obtains a value in excess of 200 for the coil quality factor. The value of $V_1$ is adjusted according to the total resistance of the magnetic circuit, $R_{s1}$. Typically the total resistance $R_{s1}$ will be about 0.5 Ohms or less, and thus $V_1$ will be about 118 Volts or less. This magnetic system, as mentioned, is for the case where one wafer at a time is subjected to burn-in, and thus the power requirements of this magnetic system 20 is not large. It should be noted that this magnetic core with air gap system can also be extended, as described hereinbelow, to the case of multi wafer burn-in system. In FIG. 3, the wafer and the decal mask on top of wafer are placed as shown inside the air gap of the magnetic core system. Reiterating the foregoing, the cross-section of the circular magnetic system, as shown in FIG. 4, has a radius $r_g$, and a cross sectional area of $A_c$. The circular magnetic core of FIG. 3 has a radius $r_c$, and the length of the circumference of the circumference of the magnetic core is $d_c$. The length of the air gap is $d_g$. The coil with N1 turns is connected to the voltage source $V_{s1}$, in series with a capacitance C1, and a resistance $R_{s1}$, which represents the total resistance of the magnetic circuit, including the coil and any other external resistance connected in series with the capacitance C1. The capacitance C1 is to provide a resonant circuit with the inductance $L_1$ of the coil. The quality factor for the resonant circuit is Q1. The frequency of the voltage source $V_{s1}$, is f, and the peak magnitude (time varying with frequency f) of the magnitude flux density at the air gap is $B_o$. The magnetic flux lines are incident perpendicular to the surface of the decal mask and generate a time varying voltage V between the terminals of a loop at the surface of the deal mask (referring FIG. 1), where the area of the loop is A. The top view of the loop is shown in FIG. 2 for the case in this invention where only one loop per chip is used, and the loop has only the two end points for making connections to the chip through the decal mask (referring to FIGS. 9 and 10). The width of the loop is W is such that the resistance of the total loop, and hence the voltage drop in the line forming the loop is sufficiently small as compared with the generated induced voltage V. The metal forming the loop is preferably made of copper; however it could also be made of aluminum.

In the following, there are set forth the preferred designed values, and ranges for all dimensions, operating variables and parameters:

f=2 MHz, with a range of 0.5 MHz to 5 MHz.
A=1 cm², with a range of 0.64 cm² to 1.69 cm²
$B_o$=20 Gauss (peak value), with range of 10 Gauss 50 Gauss
V=2.5 Volts (peak value), with a range of 2 Volts to 5 Volts.
W=400 μm, with a range of 240 μm to 620 μm
$r_g$=4.5 inches with tolerance of +/−0.30 inches. This is for the case of 8 inches diameter wafers.
$A_c$=63.62 inches², with a tolerance of +8.76 inches², and −8.2 inches².
$r_c$=21.4 inches, with a tolerance of +/−1.28 inches
$d_c$=134.5 inches, with a tolerance of +/−8.1 inches.
$d_g$=0.79 inches, with a tolerance of +/−0.05 inches.
N1=2 Turns, with a range of 1 to 4 Turns.
$I_1$=36.85 Amperes, with a range of 20 Amperes to 60 Amperes $d_1$=1.436 meters, with a tolerance of +/−0.096 meters $L_1$=14.75 μHenry, with a range of 7.4 μH to 29.5 μH.

$d_w$=5 mm, with a tolerance of +/−0.5 mm.

R1<<1 Ohms

C1=429.3 pF at 2 MHz, with a range of 214.7 pF to 858.6 pF $R_{s1}$ =0.5 Ohms or less

Q1>200

$V_1$=18 Volts, with a range of 10 Volts to 30 Volts

Figure 5:
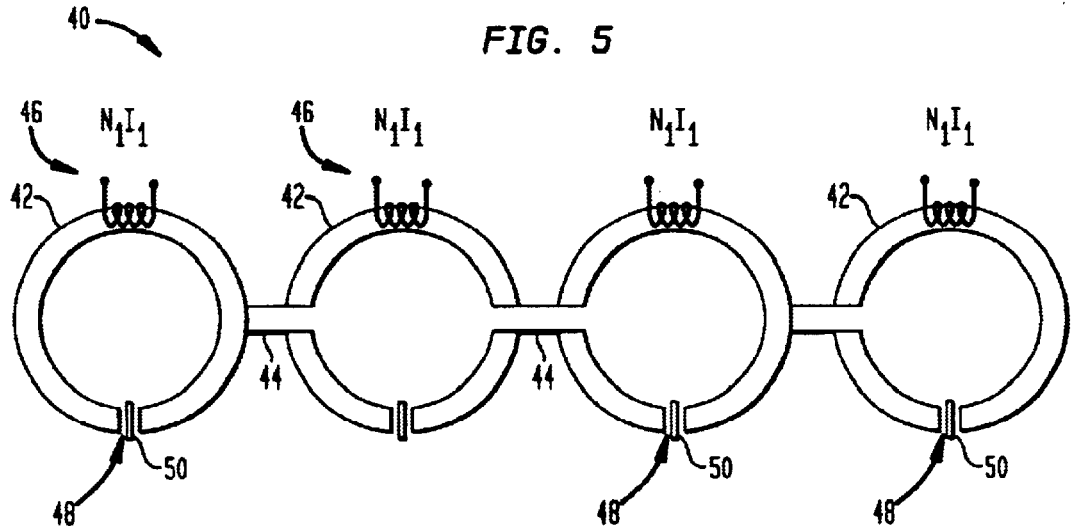
FIG. 5 illustrates a first magnetic system extended to a plurality of wafers.

The magnetic circuit of FIGS. 3, 3A and 4 can be extended, as shown in FIG. 5, to apply to the case of the burn-in of multiplicity of a wafers simultaneously in a contactless manner. The system 40 shown in FIG. 5 is an extension of FIG. 3, where the magnetic core 42 has several arms 44, whereby each arm is energized by a coil 46 of N1 turns, and there are provided several air gap 48, in which a wafer 50 is placed in each respective air gap 48. In order to calculate the power capability of this magnetic system 40, first the total input peak power supplied by the supply voltage $V_{s1}$ is given by:

$$P_{in}=V_1 \times I_1=18\times 36.85=633 \text{ Watts} \tag{14}$$

The power that is dissipated by all the chips on a wafer during the burn-in procedure is given by:

$$P_d=90 \text{ (chips/wafer)} \times 2.5 \text{ (induced voltage)} \times I_{burn-in} \tag{15}$$

where $I_{burn-in}$ is the current supplied to each chip during burn-in, which is about 0.3 Amperes for a high density SRAM chip (4 Mbit), and could be less than that for DRAMs. Substituting in equation (15), one obtains a value of 67.5 Watts for the dissipated power by a wafer during burn-in at 140 C. Comparing the values of input power ($P_{in}$=663 Watts), and the dissipated power ($P_d$=6.75 watts), one obtains a value of about 10% efficiency required of the magnetic/electric system to perform the burn-in operation on one wafer. If it is necessary to achieve the desired and sufficient power for burn-in, several coils, each with N1 turns, and each coil is supplied by a separate voltage source $V_{s1}$, and whereby current $I_{s1}$, could readily be used around the magnetic core. This could also be used for the simultaneous contactless burn-in of a multiplicity of wafers.

Figure 6:
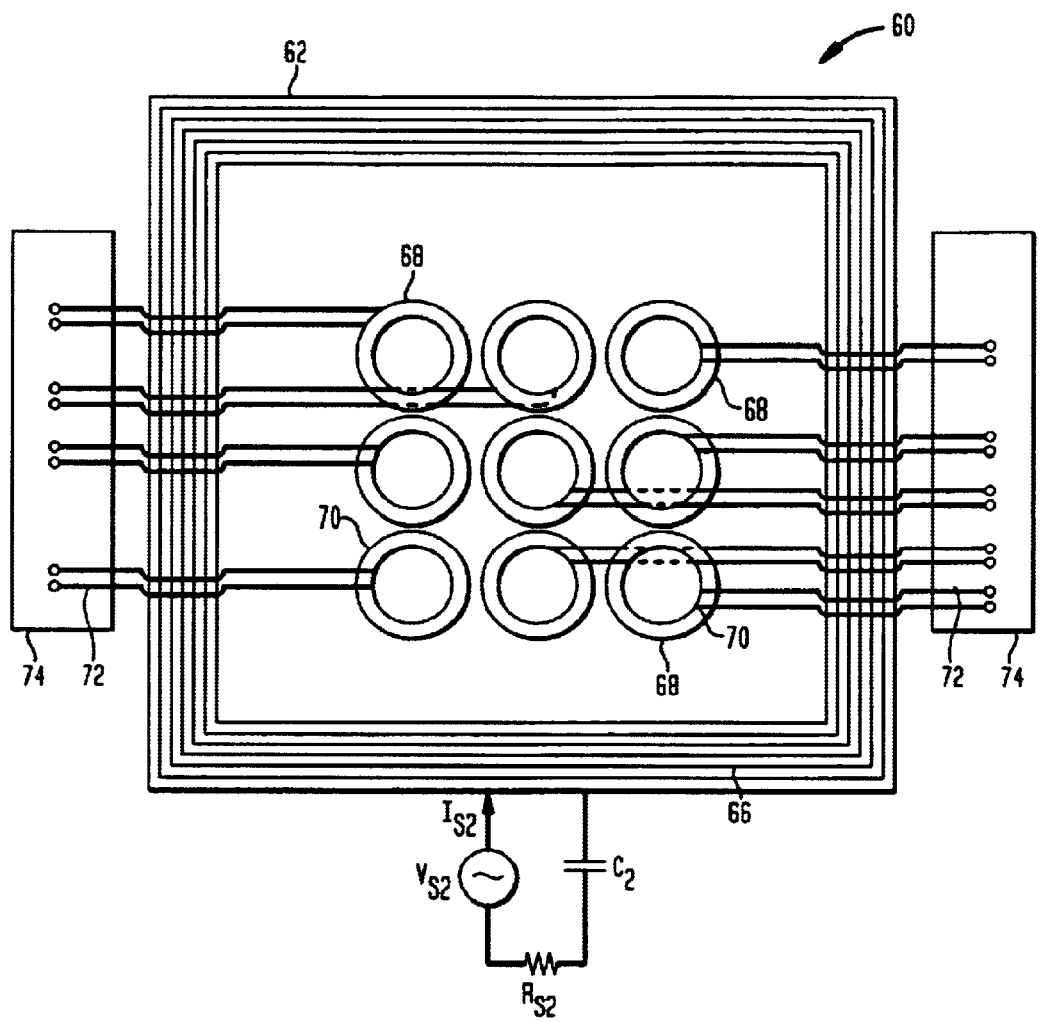
FIG. 6 illustrates a top plan view of a second magnetic system pursuant to an example of the invention.

Described hereinbelow is the second magnetic system for utilization pursuant to the invention as shown in FIG. 6 which details the top view of the second magnetic system 60 which is composed of a rectangular core 62 of non-magnetic material (relative permeability, $\mu_r$ is one). The core 62 could be made of a variety of materials, with wood being the preferred material because of weight and cost considerations. A coil 66 with N2 turns made of electric wire, is wound around the rectangular core. Various dimensions are shown in FIG. 6, with tolerances of 6% or better being acceptable. As shown in FIG. 6, up to 9 wafers 68 are placed horizontally in the center of the rectangular core 62, with a decal mask 70 on top of each wafer 68. FIG. 6 is an illustration for the use of this second magnetic system using 8-inch diameter wafers which are currently used in manufacturing; although the system of FIG. 6 could easily be extended to cover any wafer size. Also shown in FIG. 6, the decal mask 70 placed on top of each wafer 68 which provides a means for supplying the generated voltage to the chip under the decal mask. The coil around the non-magnetic core has a total length of $d_2$, and inductance of $L_2$, and is made of copper wire strands with a total diameter of $D_W$, and the total resistance of the coil is given by R2. As shown in FIG. 6, wires 72 from the decal masks 70 are run to the sides and connected to a panel 74 for direct measurements and verification of the generated voltages on each wafer 68. The coil is connected in series with a capacitance C2, and a resistance $R_{S2}$, to a time varying voltage source $V_{S2}$, which has a frequency of f1, and a peak magnitude of $V_2$. The resistance $R_{S2}$ represents the total electric resistance of the coil, the capacitance C2, the voltage source $V_{S2}$, and any additional series resistance placed in the circuit. The AC current generated in the coil is $I_{S2}$, which has a frequency of f1, and a peak amplitude of $I_2$. The current in the coil generates a magnetic field perpendicular to the surface of each wafer 68 placed in the center region of the non-magnetic core 62. The generated AC magnetic field has a frequency of f1, and a peak magnitude of $B_1$. The magnetic field is incident perpendicular at the surface of decal mask on top of each wafer, where there is a wire loop of width W, and an enclosed area A. The generated AC voltage at the terminals of the loop is V.

f1=0.4 MHz, with a range of 0.2 MHz to 0.8 MHz.

A=1 cm$^2$, with a range of 0.64 cm$^2$ to 1.69 cm$^2$ $B_1$=100 Gauss (peak value), with a range of 50 Gauss to 200 Gauss.

V=2.5 Volts (peak value), with a range of 2 Volts to 5 Volts.

W=400 μm, with a range of 240 μm to 620 μm $I_2$=250 Amperes, with a range of 150 Amperes to 350 Amperes.

N2=64 Turns, with a range of 38 Turns to 90 Turns $d_2$=512 meters, with a range of 304 meters to 720 meters.

$L_2$=40μ Henry, with a range of 23.8μ Henry to 56.3 μ Henry.

$R_{s1}$=0.5 Ohms or less $D_w$=10 mm, with a tolerance of +/−1.0 mm.

R1<<1 Ohms $C_2$=3.96 Nano Farad, with a range of 2.36 Nano Farad to 5.57 Nano Farad.

$V_2$=125 Volts, with a range of 75 Volts to 175 Volts.

The rectangular core 62 is 2 meters×2 meters in dimensions; whereby up to 9 wafers can be placed in the center of the rectangular core, as shown in FIG. 6. The coil with N2 turns is connected in series with a capacitance C2 to a time varying voltage source with an amplitude given by:

$$V_{S2}=V_2 \sin(\omega 1.t) \tag{16}$$

Frequency f1 for this magnetic system has the value of 400 KCycles/Seconds for this invention, with a range of 200 Kc/s to about 800 Kc/s. From equation (3), to obtain the same value of the maximum induced voltage V of 2.5 Volts, for the same area A as before which is 1.0 cm×1.0 cm, one needs to increase the maximum value of the time varying magnetic field density $B_o$ from 20 Gauss (which was used in the first magnetic system 20) to the following value:

$$B_1=B_o \times f/f1 \tag{17}$$

which means that the maximum value of the magnetic field density for this second magnetic system 60 is about 100 Gauss, with a range of 50 Gauss to 200 Gauss. The current in the could with N2 turns is given by:

$$I_{S2}=I_2 \sin(\omega 1.t) \tag{18}$$

The maximum value of the magnetic field density in the center of the core for this system is approximately given by Electromagnetics, 1984, Section 5-6, page 155, ibid. This is only an approximation, intended to demonstrate the operation:

$$B_1 = \mu_o I_2 N2/(2 \times a) \quad (19)$$

where a is the distance from the center of the core (at wafers) to the side of the core (about 1 meter). Substituting with the values of B1, $\mu_o$ and a, one obtains the following:

$$N2 \times I_2 = 15.92 \times 10^3 \text{ Ampere-turns} \quad (20)$$

For this second magnetic system 60, the maximum value of the current $I_2$ is set at 250 Amperes, with a range of 150 Amperes to 350 Amperes. Thus the number of turns N2 required for the second magnetic system is about 64 turns, with a range of 38 turns to 90 turns. The total length of the coil with N2 turns is given by:

$$d_2 = N2 \times (2 \times 4) \text{ Meters} \quad (21)$$

which given a value of 512 meters for $d_2$. Similarly to equation (6), the inductance $L_2$ is calculated to be about 40 $\mu$ Henry. The capacitance C2 is to provide a resonant system with the inductance $L_2$. Thus the value of the capacitance is given by:

$$C2 = 1/(\omega 1^2 \times L_2) \quad (22)$$

Thus for a frequency of 400 Kc/s for this second system, C2 is calculated to be about 3.96 Nano Farads. The coil with N2 turns is made of copper wire strands with a total diameter of about 10 mm. The total resistance of the coil is less than 1 Ohms. The maximum value of the voltage source $V_2$ is adjusted such that the maximum value of the current in the resonant circuit is $I_2$ which is set to a design value for this invention of 250 Amperes. Thus $V_{S2}$ is given by:

$$V_{S2} = I_2 . R_{S2} \quad (23)$$

Thus for a total resistance $R_{S2}$ of the resonant circuit of 0.5 Ohms, the value of $V_{S2}$ is about 125 Volts. The quality factor Q for this circuit is about 200. To calculate the power capability of this second magnetic system, first the total input peak power supplied by the power supply $V_{S2}$ is calculated as follows:

$$P_{in} = V_2 \times I_2 \quad (24)$$

Substituting for $V_2$ (125 Volts) and $I_2$ (250 Amperes), one obtains a value of 31,250 Watts for total supplied power. The total power dissipated by 9 wafers at 140° C., during burn-in is calculated as follows:

$$P_d = 9 (\text{wafers}) \times 90 (\text{chips/wafer}) \times 2.5 \text{ (induced voltage)} \times I_{burn\text{-}in} \quad (25)$$

where $I_{burn\text{-}in}$ is the current supplied to each chip at 140° C. during burn-in, which typically is about 2.0 Amperes for ASICS products or microprocessors. Substituting in equation (25), one obtains a value of 4,050 Watts for the power dissipated. Comparing the values of $P_{in}$ (21,250 Watts), and $P_d$ (4,050 Watts), one obtains a value of about 13% efficiency required for the magnetic/electric system. If it is necessary to achieve the desired power for burn-in of many wafers, several coils, each with N2 turns could be placed around the core, and each coil is supplied with a separate voltage source $V_{S2}$, and current $I_{S2}$ so that sufficient magnetic field is induced at the wafers.

Figure 7:
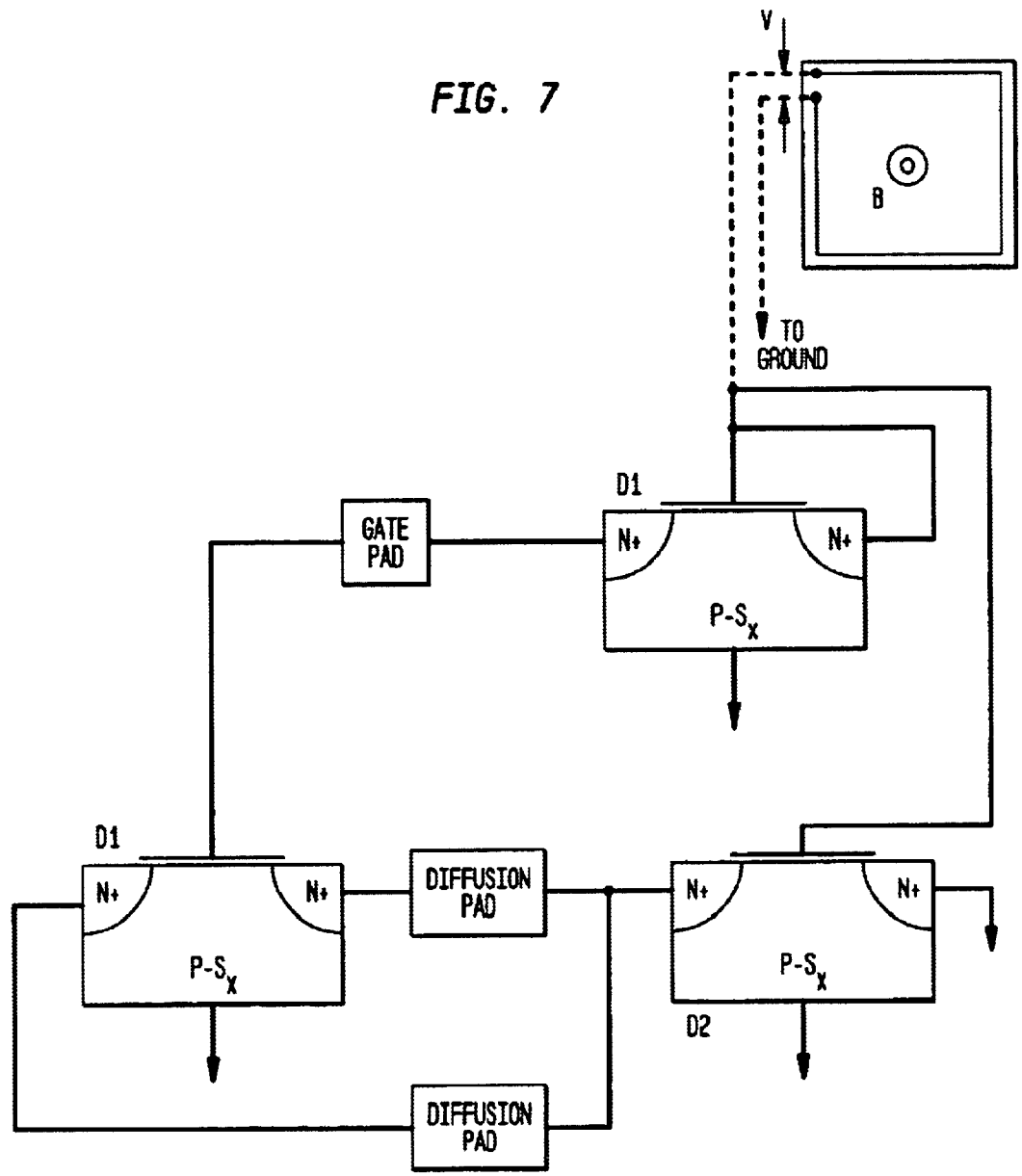
FIG. 7 illustrates an exemplary representation of utilizing the system to perform a test for gate reliability for failure mechanism.

The induced voltage V could be used to perform the reliability evaluations of various failure mechanisms for many wafers simultaneously without probe contacting of any chip. Also more than one test structure (macro) and more than one failure mechanism can be evaluated on the same wafers simultaneously, which other wise would have to be done, one mechanism and one structure at a time in the conventional probe contacting method of one chip at a time. An example of the system to be used of the reliability evaluation of the thin gate dielectric breakdown is shown in FIG. 7. The induced voltage V is produced at the special mask level at the top of the chip, and is propagated down to the chip upper metal wiring level. First, the time varying voltage V is rectified using an N+/P substrate diode of an area equal to or larger than 400 $\mu$m×400 $\mu$m. For burn-in currents in the high range, several diodes of this size would be required, also a voltage smoothing circuit will ensure that that DC produced voltage will be almost constant. As shown in FIG. 7, the gate and diffusions of the test structure (to be stressed) are connected to test pads at top metal level of the integrated chip. For this invention, the gate pad of the device under test is also connected to the diffusion of a NFET (D1). The gate of device D1 is powered to the DC rectified voltage of the induced voltage V. The other diffusion of device D1 is also connected to the rectified voltage, which, because device D1 will be "ON", is the stress voltage applied to the gate of the device under test. Under normal operation with no applied magnetic field, and no induced voltage V, the gate of device D1 will have no voltage on it, which means that device D1 will be "OFF", and thus the gate of the device under test will be floating (no forced connection), so that normal external probing can be accomplished in normal way. Similarly, the diffusion pads of the test structure (to be stressed) are connected to one diffusion of a NFET (D2). The gate of device D2 is connected to the rectified of the induced voltage V, while the other diffusion of device D2 is connected to GND. Under the application of the magnetic field, and the production of the induced voltage V, the gate of device D2 will have a voltage on it, which means that device D2 will be "ON", and the diffusions of the test structure under stress will be connected to "GND" as it is supposed to. On the other hand, under normal operation with no magnetic field, the gate of device D2 will have zero voltage on it, which means that device D2 will be "OFF", and the diffusion of the test structure will be floating (no forced connections), so that normal external probing can be accomplished. All other stress configurations for the various failure mechanisms can be similarly accomplished.

Figure 8:
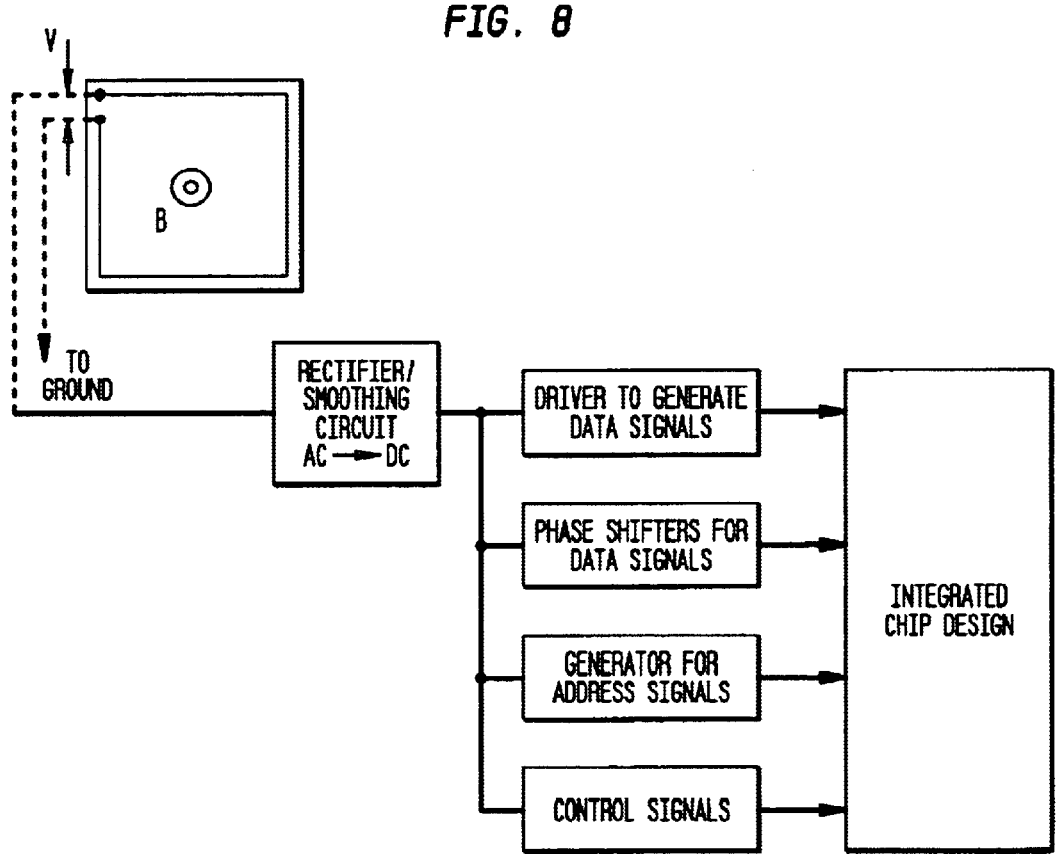
FIG. 8 illustrates a system for generating signals required for chip functional burn-in/screen.

There are now described the operations performed on the integrated chip to utilize the induced voltage V in order to accomplish the burn-in function. As shown in FIG. 8, the induced voltage V at the top of the chip by the time varying magnetic field, is propagated to the top metal level of the integrated chip, using special mask levels which will be discussed later. The voltage V which is time varying with a frequency as described above, is rectified, as shown in FIG. 8, using an N+/S×diode with an area of at least 400 $\mu$m×400 $\mu$m, and several diodes may be necessary for high currents. Also the produced DC rectified voltage is processed through smoothing circuits to produce an almost constant power supply voltage for the burn-in operation. To perform the burn-in procedure, an on-chip integrated system similar to the one shown in FIG. 8 can be used. As shown in FIG. 8, the produced DC voltage is applied to specially designed drivers to generate the signals required for functional exercise of the integrated chip (data signals). Also address signals are generated for cases of SRAM and DRAM chips, as well as necessary phase shifters to produce the desired phase between the various data signals. In conventional burn-in, these data, address, and control signals would be supplied externally to the chip through the stressor equipment. Also in some cases it would be possible to include in the design of the integrated chip, special circuits for self test of every chip as means of accomplishing in-situ testing at stress conditions. The test data can be stored on each chip using non-volatile memory technology. Otherwise, intermediate time testing of the wafers would have to be accomplished by stopping the magnetic field, and probe testing of each chip in a conventional manner.

Figure 9:
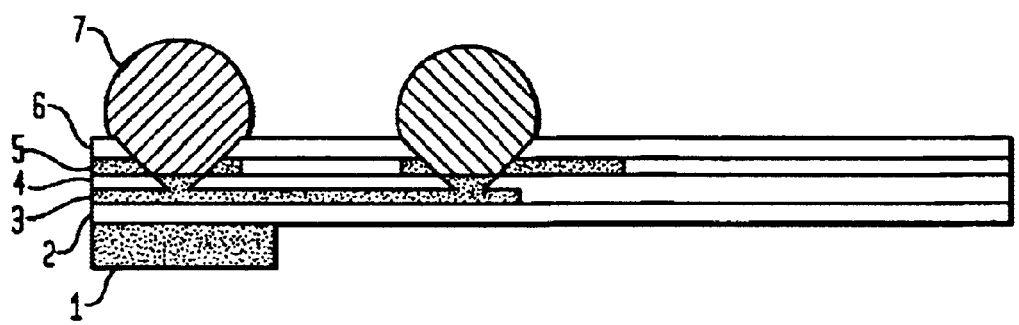
FIG. 9 and 10 diagrammatically each illustrate processing systems for respectively, P+ silicon and P− silicon substrates mounting the wafers, pursuant to the invention.
Figure 10:
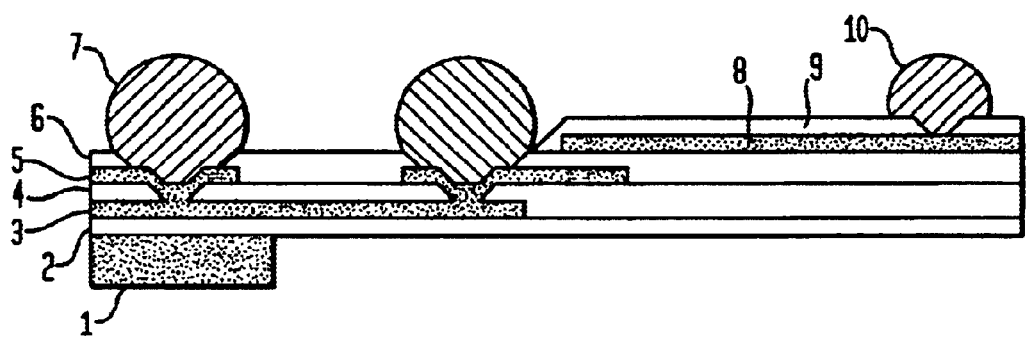

The following describes the procedure for the processing and the mask levels to measure and propagate the induced voltage to every chip of the wafer; having reference to FIGS. 9 and 10. Two systems are described, one general system (FIG. 9) more suited for P-substrates like DRAM where it would be safe to propagate the magnetic field lines to the substrate. The second system (FIG. 10) is suited for P+ substrates where the magnetic field lines are blocked, by means of a grounded metal plane, from reaching the substrate.

An interposer which allows contact to the wafer substrate can be built in the manner of a "decal", as described below.

1. A polyimide (Kapton) film (2) is rigidly affixed to a suitable frame (1) in a manner similar to that used to build x-ray masks. The frame and film are sufficiently large to completely cover a full wafer. The frame is mechanically rigid and if desired can be imparted a coefficient of thermal expansion matched to the wafer. Examples of frame materials include, silicon, invar, stainless steel. The Kapton film is typically about 100 u thick. Attachment of Kapton to the frame is accomplished using an appropriate adhesive.

2. A metal film, or stack of metal films is deposited onto the Kapton film by sputtering or evaporation. Deposition is on the side of the film opposite of the frame. A typical film stack would be comprised of Cr/Cu/Cr.

3. The metal film is then patterned to provide wiring lines (3) in areas that correspond to the "kerfs" (i.e. the area between the active chips) of the associated product wafer. These wires extend to the edge of the decal as shown in FIG. 6. These wires facilitate measuring the induced voltage. In the case of Cr/Cu/Cr, patterning can be accomplished using conventional positive photoresist technology and a sequence of etches that is appropriate for the films stack, e.g. basic permanganate to etch the Cr, followed by ammonium persulfate as the Cu etch, followed by basic permanganate.

4. After removal of the positive photoresist, the surface of the Kapton can be cleaned and activated using an aqueous solution of tetramethyl ammonium hydroxide, typically less than 5% by weight, and a polyimide film (4) applied, e.g. a PMDA-ODA polyamic acid that is converted to polyimide by heating.

5. Vias can be patterned into the polyimide film using conventional positive resist/aqueous alkali developer technology.

6. Following patterning of the vias and thermal cure of the polyimide, the Cr exposed in the bottom of the via is removed by etching. The now exposed Cu surface is cleaned, typically with a dilute aqueous solution of sulfuric acid and a $2^{nd}$ wiring layer (5) is deposited and imaged in the same manner as the $1^{st}$ wiring layer (3).

7. The $2^{nd}$ wiring layer creates the "ring wire loop" that is placed over the active area of each chip. Each "ring wire" is connected to a $1^{st}$ level "kerf" wire that extends to the perimeter of the decal. This allows an electrical bias to be placed on each "ring wire" if desired.

8. A final layer of polyimide (6) is applied and imaged over the $2^{nd}$ wiring level in the same manner as polyimide film (4). Vias are created which allow contact to the "kerf" wires at the perimeter of the decal as well as a contact at each end of the "ring wire". Structures having more layers of wires can be built by repetition. If no external contact is desired, a simplified wiring pattern can be built by deleting the $1^{st}$ wiring layer.

9. Lead/Tin bumps of desired height, e.g. about 100 u, are placed into each via and metallurgically attached to the $2^{nd}$ layer wiring by an appropriate technique, e.g. solder ink jet printing. Typically, a low temperature solder (eutectic) would be used to facilitate deposition and allow reflow (reformation) of the "spherical" shape of the contact after usage.

10. Bump height is adjusted by volume of solder deposited. By using the ink jet printing technique, the bumps at the perimeter can be of different height than the bumps over the chip region of the decal. The pattern of the bumps in the interior of the decal (the chip area) is a mirror image of the wire bond pads or C4s on the chip to be "burned in".

11. In use, the decal is mounted in an appropriate fixture such that the interior lead/tin bumps are brought into contact with the wire bond pads or C4s of the wafer to be "burned-in" and the bumps around the perimeter are brought into contact with mating contacts on the fixture.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A method for electrically stressing through a specified voltage at least one semiconductor chip on a wafer for controlled contactless burn-in, voltage screen and reliability evaluation of product wafers, said method comprising:

applying said voltage to said at least one chip for the probing thereof in the absence of physically contacting the chip surface; and interposing a mask comprising a metallic wiring line layer forming a wire loop on said wafer for magnetically inducing said voltage from ends of the wire loop providing electrical connections to said at least one chip, said mask having the voltage induced thereto when placed in a magnetic field and thereafter conducted to electrical contacts on said wafer.

2. A method as claimed in claim 1, wherein said magnetically induced voltage is produced utilizing a time varying magnetic field.

3. A method as claimed in claim 2, wherein an electrical field which is represented by said induced voltage is based on Faraday's law setting forth that said voltage which is induced by a time rate of change of a magnetic field which is fixed with respect to said magnetic field.

4. A method as claimed in claim 1, wherein said mask is positioned on said wafer; and connections are made to said at least one chip by said mask for effectuating said burn-in without interference with the normal operation of said at least one semiconductor chip.

5. A method as claimed in claim 2, wherein a loop is provided defining an area on said wafer, said mask being positioned on said wafer so as to enclose said area and having electrical contacts formed by said wire loop ends connecting to said at least one chip for an induced voltage through said time varying magnetic field within said enclosed area.

6. A method as claimed in claim 5, wherein said loop comprises a metallic line wire loop on said wafer forming an open circuit having electrical contact points provided at open ends of said wire loop of said circuit for producing said induced voltage.

7. A method as claimed in claim 6, wherein said loop is of a rectangular configuration to define a generally rectangular area on said wafer.

8. A method as claimed in claim 6, wherein said metallic line is constituted of copper.

9. A method as claimed in claim 6, wherein said metallic line is constituted of aluminum.

10. A method as claimed in claim 2, wherein said magnetic field is produced by a magnetic system which comprises a circular magnetic core having an air gap for receiving said wafer with said at least one chip and said mask positioned thereon; and a voltage source connected to an electrical coil for energizing said magnetic core to produce said induced voltage.

11. A method as claimed in claim 10, wherein said magnetic core is energized through a radio frequency voltage source.

12. A method as claimed in claim 11, wherein said circular magnetic core is constituted of a Permalloy powder having a composition 2% by weight of Mo, 81% by weight of Ni with the remainder being iron and impurities.

13. A method as claimed in claim 10, wherein said air gap receiving said wafer and mask is adapted to provide for the burn-in of differently sized wafers.

14. A method as claimed in claim 10, wherein said electrical energizing coil consists of an isolated electrical wire comprised of copper wire strands.

15. A method as claimed in claim 10, wherein said wafer and mask are retained in said air gap by a wafer holder consisting of a dielectric material.

16. A method as claimed in claim 10, wherein said magnetic core includes a plurality of said circular magnetic cores interconnected by arms, and each said core having an air gap for receiving respectively a wafer and covering mask so as to facilitate the simultaneous controlled burn-in of a plurality of said wafers.

17. A method as claimed in claim 2, wherein a rectangular core of non-magnetic material has electrical wire coils wound thereabout, said wire coils being connected to decal masks on a plurality of wafers positioned centrally on said core, each said decal mask being provided to conduct a generated voltage to a chip under said mask.

18. A method as claimed in claim 17, wherein each said coil is conducted to a time varying voltage source so as to generate a magnetic field perpendicular to the surface of each said wafer in the center of said non-magnetic core.

19. A method as claimed in claim 18, wherein electrical wires extend from each said mask to a panel for the direct measurements and verification of the direct voltages present on each of said wafer.

20. A method as claimed in claim 17, wherein said non-magnetic core is constituted of wood.

21. A method as claimed in claim 17, wherein at least nine wafers are positioned on each core for simultaneous burn-in thereof.

22. A method as claimed in claim 1, wherein said mask comprises an interposer forming a decal on said wafer surface so as to protect the surface of said wafer from direct contact with a probe during burn-in and voltage screening through electrical stressing.

23. A method as claimed in claim 22, wherein said method conducts the generated burn-in voltage to said at least one chip when mountable on P+ silicon substrates.

24. A method as claimed in claim 22, wherein said method conducts the generated burn-in voltage to said at least one chip when mountable on P− silicon substrates.

25. A method as claimed in claim 22, wherein said interposer is formed for mounting the wafer on either P+ silicon or P− silicon substrates by the steps of:

fixing a polyimide film to a frame to fully cover said wafer;

depositing at least on layer of a metallic film onto the polyimide film;

patterning said metallic film to provide wiring lines extending to the edge of said wafer to facilitate measuring the induced voltage;

removing exposed metallic layer material at the bottom of the vias and depositing a further wiring line layer forming a ring wire loop on said wafer which is connected to said first wiring lines to facilitate applying an electrical bias to each said ring wire loop;

placing lead/tin bumps into each of said vias and connecting said bumps to said further wiring lines; and adjusting bump heights whereby the pattern of the bumps interiorly of the decal mask is a mirror-image of wire bond pads or C4 connects on the wafer chip which is to be burned-in.

26. A system for electrically stressing through a specified voltage at least one semiconductor chip on a wafer for controlled contactless burn-in, voltage screen and reliability evaluation of product wafers, said system comprising:

a circuit for applying said voltage to said at least one chip for the probing thereof in the absence of physically contacting the chip surface; and a mask comprising a metallic wiring line layer forming a wire loop being arranged on said wafer through which said voltage is magnetically induced and applied to said at least one chip from ends of said wire loop providing electrical connections through the interposition of said mask onto which the voltage is induced when placed in a magnetic field and thereafter conducted to electrical contacts on said wafer.

27. A system as claimed in claim 26, wherein said induced voltage is produced by utilizing a time varying magnetic field.

28. A system as claimed in claim 27, wherein an electrical field which is represented by said induced voltage is based on Faraday's law setting forth that said voltage which is induced by a time rate of change of a magnetic field which is fixed with respect to said magnetic field.

29. A system as claimed in claim 26, wherein said induced voltage is obtained at a top layer of said mask which is positioned on said wafer; and connections are made to said at least one chip by said mask for effectuating said burn-in without interference with the normal operation of said at least one semiconductor chip.

30. A system as claimed in claim 27, wherein there is provided a loop defining an area on a wafer, said mask being positioned on said wafer so as to enclose said area; and a loop having electrical contacts formed by said wire loop ends contacting said at least one chip for an induced voltage through said time varying magnetic field being provided within said enclosed area.

31. A system as claimed in claim 30, wherein said loop comprises a metallic line wire loop on said wafer forming an open circuit having electrical contact points provided at open ends of said wire loop of said circuit for producing said induced voltage.

32. A system as claimed in claim 31, wherein said loop is of a rectangular configuration to define a generally rectangular area on said wafer.

33. A system as claimed in claim 31, wherein said metallic line is constituted of copper.

34. A system as claimed in claim 31, wherein said metallic line is constituted of aluminum.

35. A system as claimed in claim 28, wherein said magnetic field is produced by a magnetic system which comprises a circular magnetic core having an air gap for receiving said wafer with said at least one chip and said mask positioned thereon; and an electrical coil for energizing said magnetic core to produce said induced voltage.

36. A system as claimed in claim 35, wherein said electrical core is energized through a radio frequency voltage source.

37. A system as claimed in claim 36, wherein said circular magnetic core is constituted of a Permalloy powder having a composition 2% by weight of Mo, 81% by weight of Ni with the remainder being iron and impurities.

38. A system as claimed in claim 35, wherein said air gap receiving said wafer and mask is adapted to provide for the burn-in of differently sized wafers.

39. A system as claimed in claim 35, wherein said electrical energizing coil consists of an isolated electrical wire comprised of copper wire strands.

40. A system as claimed in claim 35, wherein said wafer and mask are retained in said air gap by a wafer holder consisting of a dielectric material.

41. A system as claimed in claim 35, wherein said magnetic core includes a plurality of said circular magnetic cores interconnected by arms, and each said core having an air gap for receiving respectively a wafer and covering mask so as to facilitate the simultaneous controlled burn-in of a plurality of said wafers.

42. A system as claimed in claim 27, wherein a rectangular core of non-magnetic material has electrical wire coils wound thereabout, said wire coils being connected to decal masks on a plurality of wafers positioned centrally on said core, each said decal mask being provided to conduct a generated voltage to a chip under said mask.

43. A system as claimed in claim 42, wherein each said coil is conducted to a time varying voltage source so as to generate a magnetic field perpendicular to the surface of each said wafer in the center of said non-magnetic core.

44. A system as claimed in claim 43, wherein electrical wires extend from each said mask to a panel for the direct measurements and verification of the direct voltages present on each of said wafer.

45. A system as claimed in claim 42, wherein said non-magnetic core is constituted of wood.

46. A system as claimed in claim 42, wherein at least nine wafers are positioned on each core for simultaneous burn-in thereof.

47. A system as claimed in claim 26, wherein said mask comprises an interposer forming a decal on said wafer surface so as to protect the surface of said wafer from direct contact with a probe during burn-in and voltage screening through electrical stressing.

48. A system as claimed in claim 47, wherein said method conducts the generated burn-in voltage to said at least one chip when mountable on P+ silicon substrates.

49. A system as claimed in claim 47, wherein said method conducts the generated burn-in voltage to said at least one chip when mountable on P− silicon substrates.

50. A system as claimed in claim 47, wherein said interposer is formed for mounting the wafer on either P+ silicon or P− silicon substrates by means of:
fixing a polyimide film to a frame to fully cover said wafer;
depositing at least on layer of a metallic film onto the polyimide film;
patterning said metallic film to provide wiring lines extending to the edge of said wafer to facilitate measuring the induced voltage;
removing exposed metallic layer material at the bottom of the vias and depositing a further wiring line layer forming a ring wire loop on said wafer which is connected to said first wiring lines to facilitate applying an electrical bias to each said ring wire loop;
placing lead/tin bumps into each of said vias and connecting said bumps to said further wiring lines; and
adjusting bump heights whereby the pattern of the bumps interiorly of the decal mask is a mirror-image of wire bond pads or C4 connects on the wafer chip which is to be burned-in.

* * * * *